US011366399B2

(12) United States Patent
Van Greevenbroek

(10) Patent No.: US 11,366,399 B2
(45) Date of Patent: Jun. 21, 2022

(54) LASER BEAM MONITORING SYSTEM

(71) Applicant: ASML Netherlands B.V., Veldhoven (NL)

(72) Inventor: Hendrikus Robertus Marie Van Greevenbroek, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 165 days.

(21) Appl. No.: 16/765,364

(22) PCT Filed: Oct. 26, 2018

(86) PCT No.: PCT/EP2018/079420
§ 371 (c)(1),
(2) Date: May 19, 2020

(87) PCT Pub. No.: WO2019/105664
PCT Pub. Date: Jun. 6, 2019

(65) Prior Publication Data
US 2020/0341386 A1  Oct. 29, 2020

(30) Foreign Application Priority Data
Nov. 29, 2017 (EP) .................... 17204356

(51) Int. Cl.
G03F 7/00 (2006.01)
G01J 1/04 (2006.01)
(Continued)

(52) U.S. Cl.
CPC .......... G03F 7/7085 (2013.01); G01J 1/0407 (2013.01); G01J 1/0477 (2013.01);
(Continued)

(58) Field of Classification Search
CPC ...... G01J 1/0407; G01J 1/0477; G01J 1/4257; G02B 27/106; G03F 7/70033;
(Continued)

(56) References Cited

U.S. PATENT DOCUMENTS

2006/0202115 A1* 9/2006 Lizotte .................. H04N 1/047
250/234
2014/0333915 A1  11/2014 Hoogkamp et al.
(Continued)

FOREIGN PATENT DOCUMENTS

| JP | H02 201105 A | 8/1990 | |
| JP | H03 269311 A | 11/1991 | |
| WO | WO-2019048657 A1 * | 3/2019 | ........... B23K 26/043 |

OTHER PUBLICATIONS

International Search Report and Written Opinion of the International Searching Authority directed to related International Patent Application No. PCT/EP2018/079420, dated Feb. 21, 2019; 11 pages.
(Continued)

Primary Examiner — Mark R Gaworecki
(74) Attorney, Agent, or Firm — Sterne, Kessler, Goldstein & Fox P.L.L.C.

(57) ABSTRACT

A laser beam monitoring system configured to monitor an attribute of an incident laser beam (24), the laser beam monitoring system comprising a beam separating element (30) and a plurality of sensors (34a-34d), wherein the beam separating element is configured to form a plurality of sub-beams (24a-24d) from the incident laser beam (24), a first sub-beam being directed towards a first sensor of the plurality of sensors and a second sub-beam being directed towards a second sensor of the plurality of sensors, wherein relative intensities of the first and second sub-beams are (Continued)

determined by a spatial position at which the incident laser beam is incident upon the beam separating element.

22 Claims, 8 Drawing Sheets

(51) Int. Cl.
| | | |
|---|---|---|
| *G01J 1/42* | (2006.01) | |
| *G02B 27/10* | (2006.01) | |
| *H01S 3/00* | (2006.01) | |
| *G03F 7/20* | (2006.01) | |
| *H05G 2/00* | (2006.01) | |

(52) U.S. Cl.
CPC .......... *G01J 1/4257* (2013.01); *G02B 27/106* (2013.01); *G03F 7/70033* (2013.01); *H01S 3/0014* (2013.01); *H05G 2/008* (2013.01); *H01S 3/0071* (2013.01)

(58) Field of Classification Search
CPC .... G03F 7/7085; H01S 3/0014; H01S 3/0071; H05G 2/008
See application file for complete search history.

(56) References Cited

U.S. PATENT DOCUMENTS

| | | |
|---|---|---|
| 2014/0374605 A1 | 12/2014 | Mizoguchi et al. |
| 2016/0341969 A1 | 11/2016 | Manger |
| 2017/0150591 A1 | 5/2017 | Ando et al. |

OTHER PUBLICATIONS

International Preliminary Report on Patentability directed to related International Patent Application No. PCT/EP2018/079420, dated Jun. 2, 2020; 7 pages.

\* cited by examiner

LASER BEAM MONITORING SYSTEM

CROSS-REFERENCE TO RELATED APPLICATIONS

This application claims priority of EP application 17204356.4 which was filed on Nov. 29, 2017 and which is incorporated herein in its entirety by reference.

FIELD

The present invention relates to a laser beam monitoring system. The laser beam monitoring system may form part of a radiation source for a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines, in part, the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

EUV radiation used by a lithographic apparatus may be generated using an EUV emitting plasma. In one arrangement, referred to as a laser produced plasma (LPP) source, a laser deposits energy into a fuel such as tin. This converts the fuel into a plasma which emits EUV radiation. The fuel is in the form of droplets which travel across an open space within the radiation source. Pulses of the laser beam are synchronised with the fuel droplets. In addition to synchronising laser pulses with the fuel droplets, the spatial position of the laser beam is adjusted to ensure that the laser beam pulses are incident upon the fuel droplets. The adjustment of the laser beam position may be made with reference to trajectories of the fuel droplets. In order to make sufficiently accurate adjustments of the laser beam it is desirable to be able to monitor the position of the laser beam. It may be desirable to monitor the trajectories of the fuel droplets. It may also be desirable to monitor other properties of the laser beam or of the fuel droplets.

Accordingly it may be desirable to provide a laser beam monitoring system which provides laser beam monitoring in a manner that is not taught or suggested by the prior art.

SUMMARY

According to a first aspect of the invention there is provided a laser beam monitoring system configured to monitor an attribute of an incident laser beam, the laser beam monitoring system comprising a beam separating element and a plurality of sensors, wherein the beam separating element is configured to form a plurality of sub-beams from the incident laser beam, a first sub-beam being directed towards a first sensor of the plurality of sensors and a second sub-beam being directed towards a second sensor of the plurality of sensors, wherein relative intensities of the first and second sub-beams are determined by a spatial position at which the incident laser beam is incident upon the beam separating element.

The invention advantageously allows a 'center of gravity' of the incident laser beam to be determined in a straightforward manner. This determination of the center of gravity is substantially unaffected by variation of a cross-sectional shape of the incident laser beam.

First parts of the beam separating element which form the first sub-beam may be intermixed with second parts of the beam separating element which form the second sub-beam.

The first parts may occupy a greater proportion of a first area of the beam separating element than the second parts. The second parts may occupy a greater proportion of the second area of the beam separating element than the first parts.

The beam separating element may be configured to also form a third sub-beam directed towards a third sensor of the plurality of sensors and a fourth sub-beam directed towards a four sensor of the plurality of sensors. Relative intensities of the first, second, third and fourth sub-beams may be determined by the spatial position at which the incident laser beam is incident upon the beam separating element.

First parts of the beam separating element which form the first sub-beam, second parts of the beam separating element which form the second sub-beam, third parts of the beam separating element which form the third sub-beam, and fourth parts of the beam separating element which form the fourth sub-beam may be intermixed with each other.

The first parts may occupy a greater proportion of a first area of the beam separating element than any of the second, third or fourth parts. The second parts may occupy a greater proportion of a second area of the beam separating element than any of the first, third or fourth parts. The third parts may occupy a greater proportion of a third area of the beam separating element than any of the first, second or fourth parts. The fourth parts may occupy a greater proportion of a fourth area of the beam separating element than any of the first, second or third parts.

The different parts may be provided with weighted spatial distributions across the beam separating element.

The spatial distribution of the first part may be weighted towards a first zone of the beam separating element, such that when the incident laser beam is incident upon the first zone the incident laser beam predominantly forms the first sub-beam. The spatial distribution of the second part may be weighted towards a second zone of the beam separating element, such that when the incident laser beam is incident upon the second zone the incident laser beam predominantly forms the second sub-beam. Corresponding spatial distributions may be provided for third and fourth parts of the beam separating element.

The first and second zones may each comprise one quarter of the beam separating element.

The beam separating element may comprise cells formed from the different parts.

The areas of different parts which form the cells may vary as a function of spatial cell position across the beam separating element.

The beam separating element may be a refractive optical element. Alternatively, the beam separating element may be a reflective optical element. In general, embodiments of the invention may be formed using reflective elements instead of transmissive elements.

The beam separating element may be a diffractive optical element.

Focusing optics may be provided between the beam separating element and the sensors.

The beam separating element may be transmissive.

According to a second aspect of the invention there is provided a radiation source comprising a laser system, a laser beam monitoring system, a fuel emitter and a radiation collector. The laser beam monitoring system may comprise a beam separating element and a plurality of sensors, wherein the beam separating element is configured to form a plurality of sub-beams from the incident laser beam, a first sub-beam being directed towards a first sensor of the plurality of sensors and a second sub-beam being directed towards a second sensor of the plurality of sensors, wherein relative intensities of the first and second sub-beams are determined by a spatial position at which the incident laser beam is incident upon the beam separating element.

The radiation source may further comprise a controller arranged to adjust the laser beam using outputs received from the plurality of sensors.

The radiation source may further comprise a second laser beam monitoring system configured to monitor an attribute of the laser beam after reflection from a fuel target.

According to a third aspect of the invention there is provided a lithographic system comprising a lithographic apparatus arranged to project a pattern from a patterning device onto a substrate and comprising the radiation source of the second aspect of the invention.

According to a fourth aspect of the invention there is provided a method of monitoring a laser beam, the method comprising directing an incident laser beam onto a beam separating element, forming a plurality of sub-beams from the incident laser beam, detecting a first sub-beam using a first sensor of a plurality of sensors, and detecting a second sub-beam using a second sensor of the plurality of sensors, wherein relative intensities of the first and second sub-beams are determined by a spatial position at which the incident laser beam is incident upon the beam separating element.

According to a fifth aspect of the invention there is provided a beam separating element configured for use in the laser beam monitoring system of the first aspect of the invention.

Different features of different aspects of the invention may be combined together.

BRIEF DESCRIPTION OF THE DRAWINGS

Embodiments of the invention will now be described, by way of example only, with reference to the accompanying schematic drawings, in which.

Throughout the drawings, same reference numerals indicate similar or corresponding features.

DETAILED DESCRIPTION

Figure 1:
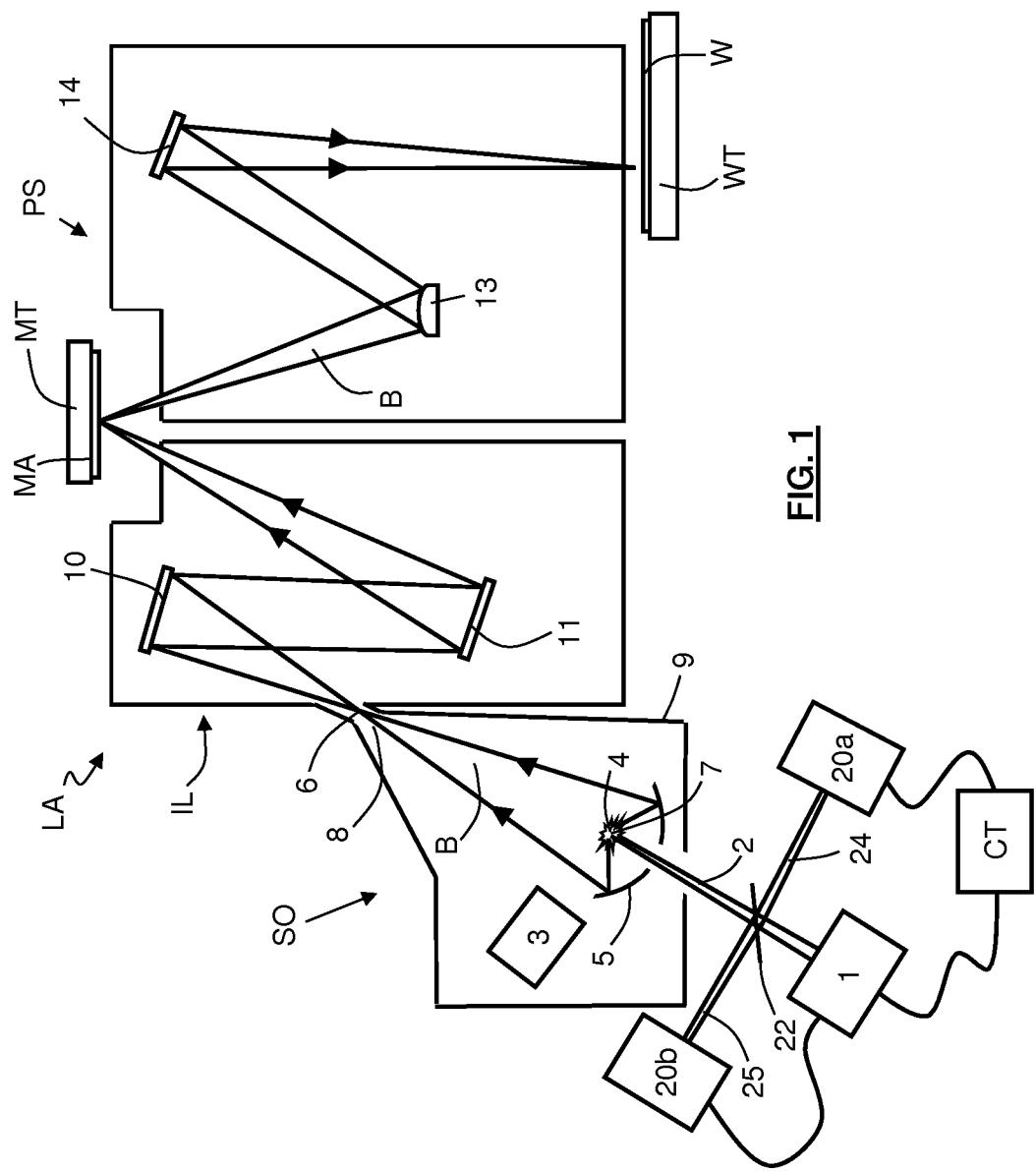
FIG. 1 depicts a lithographic system comprising a lithographic apparatus and a radiation source according to an embodiment of the invention.

FIG. 1 shows a lithographic system including a laser beam monitoring system 20 according to an embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source. A laser system 1, which may for example be a pulsed $CO_2$ laser, is arranged to deposit energy via a laser beam 2 into a fuel target, such as tin (Sn) which is provided from a fuel emitter 3. Although tin is referred to in the following description, any suitable fuel such as a metal or alloy may be used. The fuel emitter 3 may comprise a nozzle configured to direct fuel, e.g. in the form of droplets, along a trajectory towards a plasma formation region 4. The laser beam 2 is incident upon the fuel target at the plasma formation region 4. The deposition of laser energy into the fuel target creates a plasma 7 at the plasma formation region 4. Radiation, including EUV radiation, is emitted from the plasma 7 during de-excitation and recombination of electrons and ions of the plasma.

The EUV radiation is collected and focused by a near-normal incidence radiation collector 5 (sometimes referred to more generally as a normal-incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two focal points. A first focal point may be at the plasma formation region 4, and a second focal point may be at an intermediate focus 6, as discussed below.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a faceted field mirror device 10 and a faceted pupil mirror device 11. The faceted field mirror device 10 and faceted pupil mirror device 11 together provide the radiation beam B with a desired cross-sectional shape and a desired angular intensity distribution in a cross-section of the radiation beam B. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system PS comprises a plurality of mirrors which are configured to project the radiation beam B onto a substrate W held by the substrate table WT. The projection system PS may apply a reduction factor to the radiation beam B, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

The radiation source SO further comprises laser beam monitoring systems 20*a,b* according to embodiments of the invention. A beam splitter 22 is arranged to split off a portion 24 of the laser beam 2 and direct it towards a first laser beam monitoring system 20*a*. The first laser beam monitoring system 20*a* is configured to monitor the spatial position of the split off portion 24 of the laser beam 2. This allows the spatial position at which the laser beam 2 is incident at the plasma formation region 4 to be determined. An output signal from the first laser beam monitoring system 20*a* passes to a controller CT. The controller CT uses this signal to adjust the position of the laser beam 2. The radiation source may also include an imaging system (not shown) or other system which tracks the trajectories of fuel targets as they travel across the enclosing structure 9 of the radiation source SO. An output signal from this tracking system may also pass to controller CT. The output signals from the first laser beam monitoring system 20*a* and from the fuel target tracking system may be used by the controller CT to ensure that pulses of the laser beam 2 are incident upon fuel targets in the plasma formation region 4. The controller CT may apply adjustments to the spatial position or pointing direction of the laser beam 2 output from the laser system 1 to accommodate, for example, deviations of fuel target trajectories, and/or variations of the laser beam 2 itself. A variation of the laser beam 2 may for example be positional fluctuation of the laser beam, which may arise from some instability within the laser system 1. A variation of the laser beam 2 may for example be a movement of the spatial position of the highest intensity area of the laser beam (e.g. a change from a Gaussian profile to some other profile).

The fuel target has some reflectivity, and as a result a portion of the laser beam 2 which is not absorbed by the fuel target is reflected from the fuel target. This portion may be referred to as the reflected laser beam. The reflected laser beam passes to the beam splitter 22 which splits off a portion 25 of the reflected laser beam and directs it towards a second laser beam monitoring system 20*b*. The second laser beam monitoring system 20*b* is configured to monitor the spatial position of the split off portion 25 of the reflected laser beam. This allows the position of the of the fuel target which reflected the laser beam 2 to be determined. An output signal from the second laser beam monitoring system 20*b* passes to the controller CT. This signal may also be used by the controller when adjusting the position or pointing of the laser beam 2. In an embodiment the controller CT may compare outputs from the first and second laser beam monitoring systems 20*a,b* to obtain information regarding relative alignment between the laser beam 2 and fuel targets.

Figure 2A:
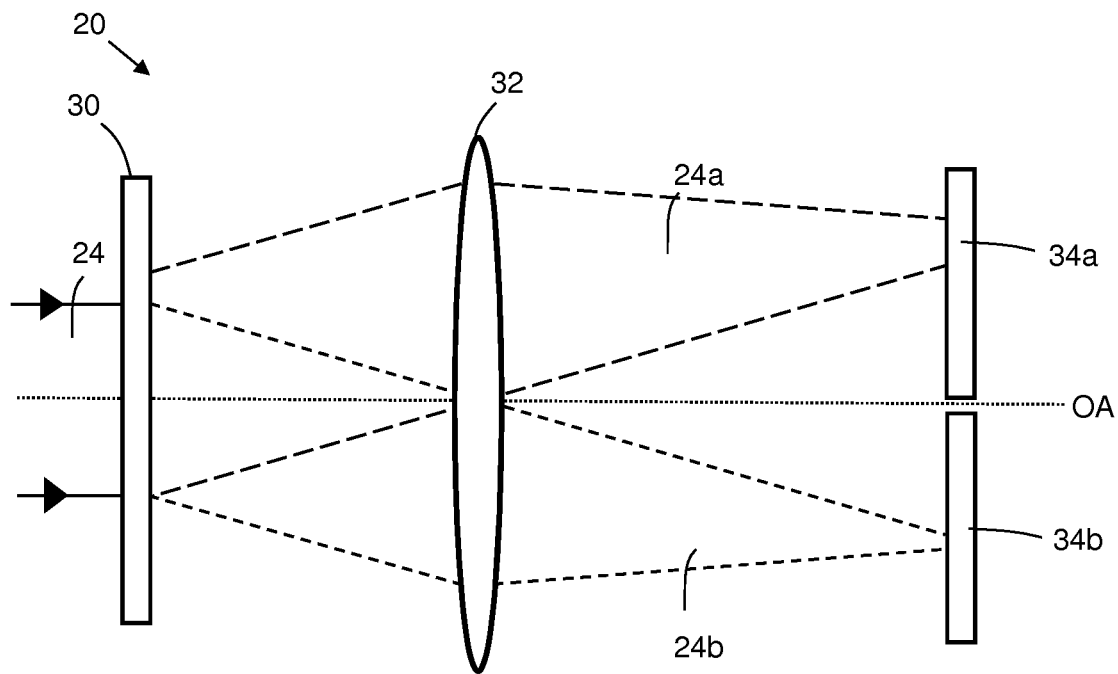
FIGS. 2A-2B depict a laser beam monitoring system according to an embodiment of the invention.
Figure 2B:
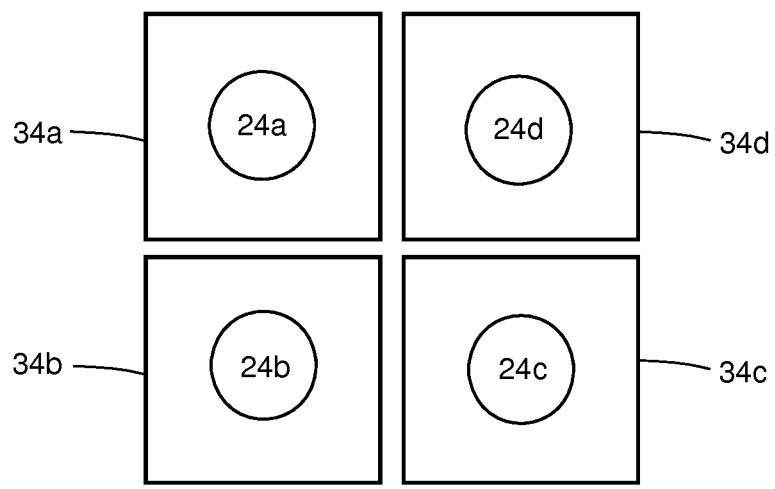

An embodiment of the laser beam monitoring systems 20*a,b* is schematically depicted in FIG. 2. The first and second laser beam monitoring systems 20*a,b* may be the same as each other and in the remainder of this description are referred to as laser beam monitoring system 20. For ease of terminology only the split off portion 24 of the laser beam 2 is depicted and labelled. The split off portion 25 of the reflected laser beam is not shown, although embodiments of the invention may determine the position of the split off portion of the reflected laser beam. FIG. 2A depicts the laser beam monitoring system 20 in cross-section, and FIG. 2B depicts sensors of the laser beam monitoring system viewed from the front. The laser beam monitoring system 20 comprises a beam separating element 30, a converging lens 32 and four sensors 34*a-d*. An optical axis 0A of the system 20 is indicated in FIG. 2A. The beam separating element 30 may for example be a so-called refractive optical element (ROE), or a so called diffractive optical element (DOE) or may take some other form (as explained further below). Only two of the sensors 34*a,b* are depicted in FIG. 2A whereas all four of the sensors 34*a-d* are depicted in FIG. 2B.

The sensors 34*a-d* may be located a focal length away from the converging lens 32. The converging lens 32 ensures that sub-beams formed by the beam separating element 30 (described below) are fully separated before they are incident upon the sensors 34*a-d*. Although a single refractive lens 32 is depicted in FIG. 2A, any suitable focusing optics may be used to separate the sub-beams.

The split-off portion of the laser beam 24 is incident upon the beam separating element 30. For ease of terminology this laser beam is hereafter referred to as the incident laser beam 24. The beam separating element 30 separates the incident laser beam 24 into four sub-beams 24*a-d* via a mechanism which is described further below. Each sub-beam 24*a-d* is focused by the converging lens 32 onto a different sensor 34*a-d*. The beam separating element 30 is arranged such that the proportion of the incident laser beam 24 which is separated into a specific one of the sub-beams 24*a-d* depends upon the spatial position of the laser beam 24, relative to the beam separating element 30, when the laser beam 24 is incident upon the beam separating element 30. Two of the sub-beams 24*a,b* are depicted in FIG. 2. Dashed lines with dashes of different lengths are used in order to allow the sub-beams 24*a,b* to be easily distinguished from each other in the diagram.

In some embodiments a converging lens (not depicted) or mirror (not depicted) may be provided upstream of the beam separating element 30. This may be done for example if a converging lens (or mirror) is also located between the beam splitter 22 and the plasma formation region 4 of the radiation source SO in order to focus the laser beam 2 onto the plasma formation region. In such an embodiment, the converging lens upstream of the beam separating element 30 mimics the effect of the converging lens upstream of the plasma formation region 4, such that the output of the first laser beam monitoring system 20a corresponds with behaviour of the laser beam 2 at the plasma formation region 4. In other embodiments the converging lens upstream of the beam separating element 30 may be omitted.

Although four sub-beams and four sensors are depicted in FIG. 2, any other number of sub-beams and any other number of sensors may be used. The sensors may have any desired spatial distribution, for example determined by the directions which are applied to the sub-beams by the beam separating element 30. In an embodiment the beam separating element 30 may generate multiple diffraction orders, for example first and second diffraction orders. In such a case the multiple diffraction orders (e.g. first and second diffraction orders) may both be incident upon the same sensor. Alternatively, the multiple diffraction orders may be incident upon different sensors.

Figure 3A:
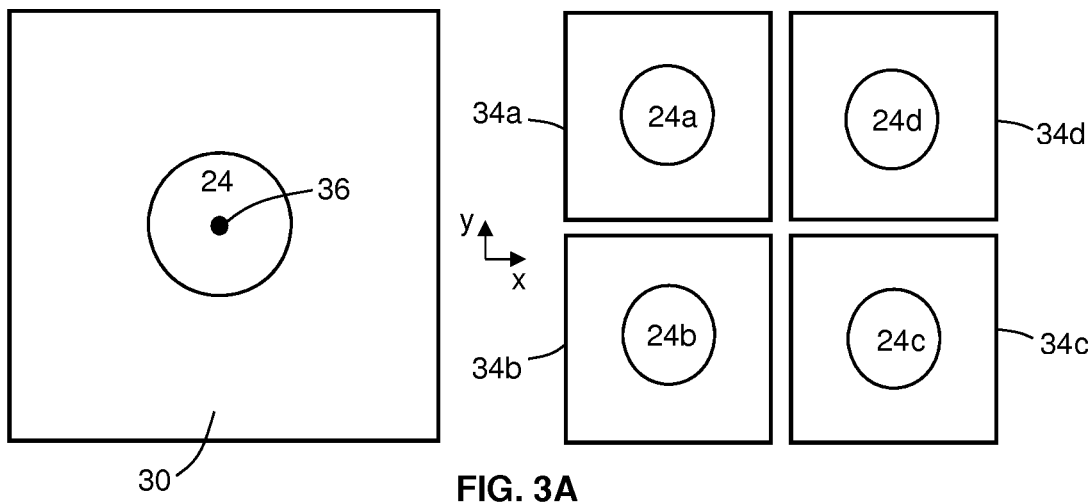
FIGS. 3A-3C depict an operation of the laser beam monitoring system of FIG. 2.

FIG. 3 schematically depicts the manner in which (in one embodiment) the beam separating element 30 separates the incident laser beam 24 into the four sub-beams 24a-d. In FIG. 3A the incident laser beam 24 is incident at the center 36 of the beam separating element 30. The center 36 may be referred to as the central reference position. The central reference position may correspond with the optical axis OA of the beam monitoring system 20. The beam separating element 30 separates the incident laser beam 24 into four sub-beams 24a-d of equal intensity. Each sensor 34a-d provides an associated output signal which indicates the intensity of the sub-beam 24a-d incident upon that specific sensor. In the situation depicted in FIG. 3A each sensor 34a-d gives a similar output signal, indicating that the incident laser beam 24 was incident at the center 36 of the beam separating element 30. The signals output from the sensors 34a-d may differ slightly from each other due to differences between the performances of the sensors. A calibration may be used to take account of such differences.

Although in this embodiment the center 36 of the beam separating element 30 separates the incident laser beam 24 into four sub-beams 24a-d of equal intensity, in other embodiments the center of the beam separating element may separate the incident laser beam into sub-beams of unequal intensity. Where this is the case, the unequal intensity of signals output from the sensors 34a-d may be calibrated for during processing of the signals. Thus, the position of the incident laser beam 24 with respect to a center of the beam separating element 30 may still be determined. Although in this embodiment the position of the incident laser beam 24 is determined relative to the center of the beam separating element 30, in other embodiments the position of the incident laser beam may be determined with reference to a position on the beam separating element which is not the center of the beam separating element.

Figure 3B:
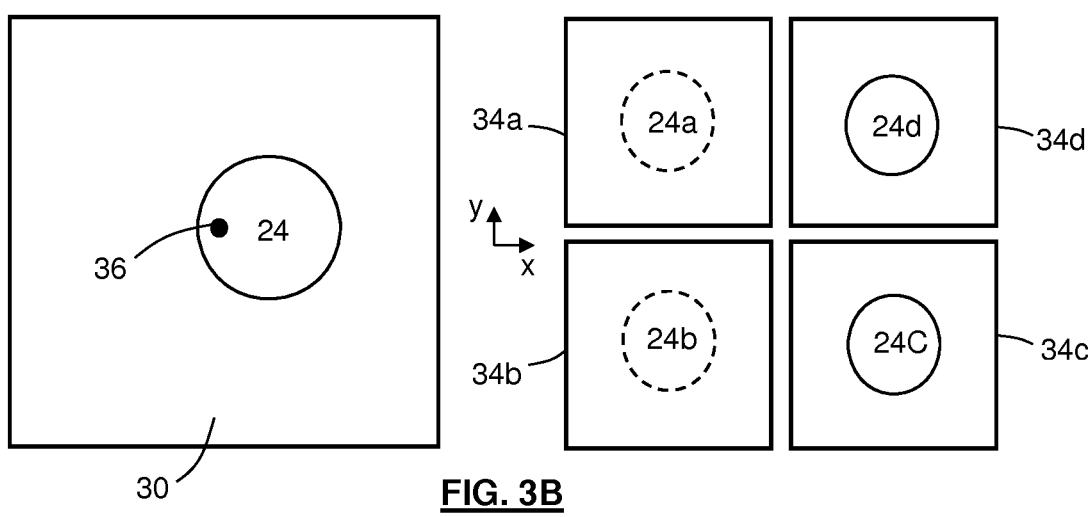

In FIG. 3B the incident laser beam 24 is shifted to the right of the central reference position 36 on the beam separating element 30. Cartesian coordinates are included on this figure and other figures. The shift to the right may be referred to as a shift in the x-direction. The beam separating element 30 again separates the incident laser beam into four sub-beams 24a-d, an individual one of which is incident upon an individual one of the sensors 34a-d. However, in this case the intensity of the sub-beams 24c,d on the right hand side sensors 34c,d is greater than the intensity of the sub-beams 24a,b on the left hand side sensors 34a,b. This is indicated schematically by depicting the sub-beams 24a,b on the left hand side sensors 34a,b with dashed lines. The output signals from the right hand sensors 24c,d have higher magnitude than the output signals from the left hand sensors 24a,d. This indicates an x-direction shift of the incident laser beam 24. Output signals from the upper sensors 24a,d correspond with output signals from the lower sensors 24b,c, thus indicating that there has been no y-direction shift of the incident laser beam 24.

In this embodiment a shift of the incident laser beam 24 to the right increases the intensity of sub-beams 24c,d incident upon the right hand sensors 34c,d. In an alternative embodiment however, a shift of the incident laser beam 24 to the right may increase the intensity of sub-beams 24a,b incident upon the left hand sensors 34a,b (or the upper sensors or the lower sensors). This may be achieved via use of an appropriate arrangement of cells on the beam separating element 30 (cells are discussed further below).

Figure 3C:
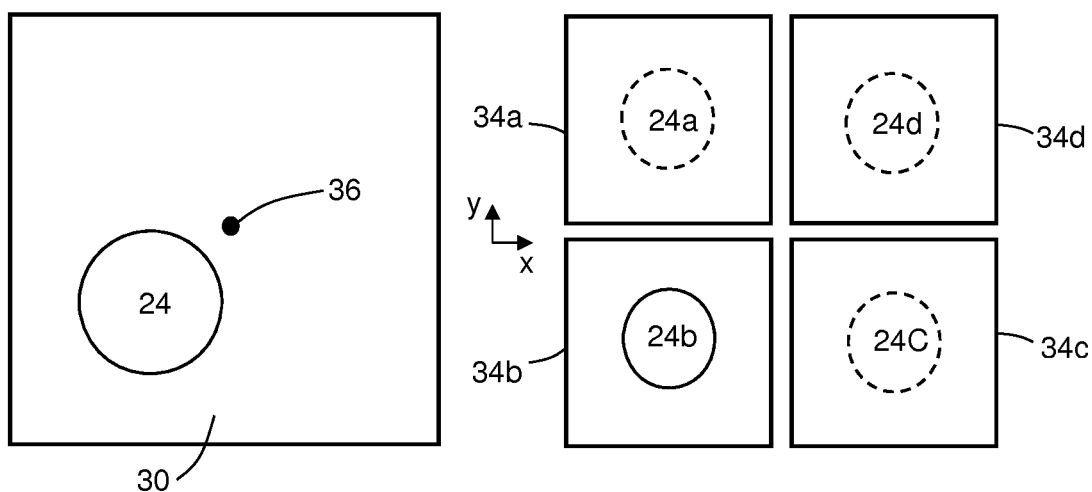

In FIG. 3C the incident laser beam 24 has moved downwards and to the left relative to the central reference position 36 on the beam separating element 30. This may be referred to as a shift in the −x and −y directions. The beam separating element 30 again separates the incident laser beam 24 into four sub-beams 24a-d which are incident upon the sensors 34a-d. However, in this case the sub-beam 24b incident upon the bottom left hand sensor 34b has a higher intensity than the sub-beams 24a,c,d incident upon the other sensors 34a,c,d (lower intensity sub-beams are depicted using dashed lines). The output signal from the bottom left hand sensor 34b has a higher magnitude than the output signals from the other sensors 34a,c,d. This indicates a shift of the incident laser beam 24 in the −x and −y directions.

The beam separating element 30 is configured such that it separates the incident laser beam 24 into sub-beams 24a-d which have intensities that vary gradually as a function of incident laser beam position on the beam separating element. For example, a gradual movement of the incident laser beam 24 will cause a gradual change of the relative intensities of the sub-beams 24a-d formed by the beam separating element 30.

The signals output from the sensors 34a-d may be combined together when they are used by the controller CT to control the laser system 1. For example, the output signals from the left hand pair of sensors 34a,b may be added together to form a left hand sum, and the output signals from the right hand pair of sensors 34c,d may be added together to form a right hand sum. The left hand sum may be subtracted from the right hand sum to give a value indicative of the x-direction position of the incident laser beam 24. This value may be used to adjust the x-direction position of the laser beam 2 output by the laser system 1. A corresponding approach may be used to obtain a value indicative of y-direction position of the incident laser beam 24, and to adjust the y-direction position of the laser beam 2 output by the laser system 1. The signals output from the sensors 34a-d may be processed in other ways to determine the position of the incident laser beam 24. Some processing of the output signals may be performed before they are summed or subtracted, to take into account differing responses of the sensors 34a-d. The processing may comprise applying weighting factors to the signals which compensate for the differing responses.

Figure 4:
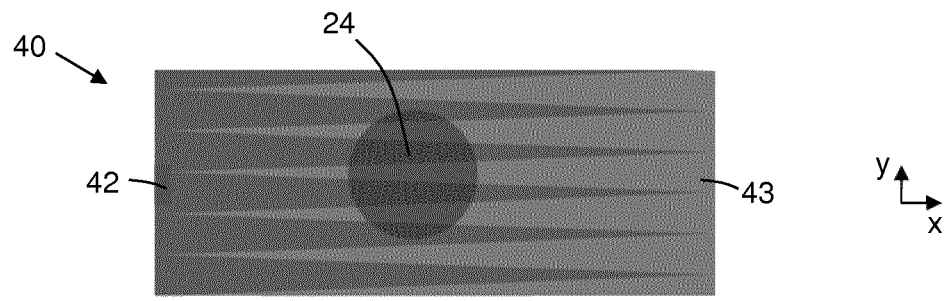
FIG. 4 depicts a beam separating element which may form part of a laser beam monitoring system according to an embodiment of the invention.

FIG. 4 schematically depicts a beam separating element 40 according to a simplified embodiment. The beam separating element 40 in this example is configured to separate an incident laser beam 24 into two sub-beams rather than four sub-beams. The beam separating element 40 comprises a first part 42 which is configured to form a sub-beam directed towards a first sensor (not depicted) and a second part 43 configured to form a sub-beam directed towards a second sensor (not depicted). As may be seen, the first part 42 is indicated in a darker shade of the color gray, the second part 43 is indicated in a lighter shade of the color gray, and the first part 42 includes tapering portions which are intermixed with corresponding tapering portions of the second part 43. These tapering portions provide a weighting of the intensity of the sub-beams, the weighting of the intensity being determined by the position of the incident beam 24 with respect to a central reference position on the beam separating element 40. As will be appreciated, a displacement of the incident laser beam 24 to the right (in the x-direction) relative to the central reference position will mean that the laser beam is incident upon a larger proportion of the second part 43 than the first part 42 of the beam separating element 40. Consequently, the sub-beam which is incident upon the second detector will have a greater intensity than the sub-beam which is incident upon the first detector. Similarly, if the incident laser beam 24 is displaced to the left (-x-direction) relative to the central reference position, then the intensity of the sub-beam incident upon the first detector will be greater than the intensity of the other sub-beam incident upon the second detector. The tapering nature of the intermixed portions of the first and second parts 42, 43 of the beam separating element 40 are such that the intensities of the sub-beams which are formed vary gradually as a function of the x-direction position of the incident laser beam 24 on the beam separating element. A gradual movement of the incident laser beam 24 will cause a gradual change of the relative intensities of the sub-beams formed by the beam separating element 40. Movement of incident laser beam 41 up and down (in the y-direction) will not change the relative intensities of the sub-beams incident upon the first and second sensors in this simplified embodiment.

Figure 5A:
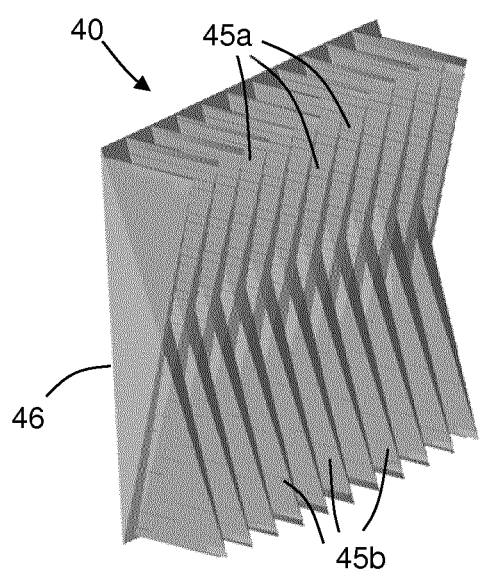
FIGS. 5A-5C depict a construction which may be used to form the beam separating element of FIG. 4.
Figure 5B:
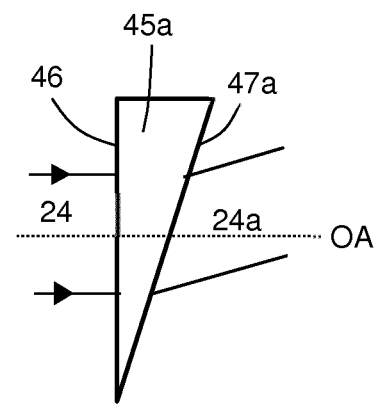
Figure 5C:
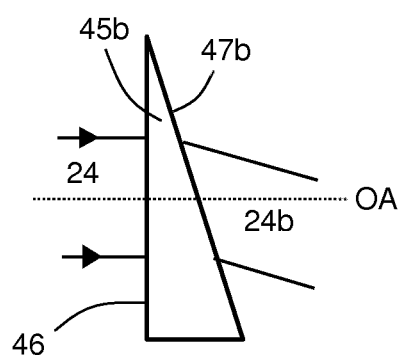

FIG. 5A depicts in perspective view an implementation of the beam separating element 40 described above in connection with FIG. 4. The implementation comprises a series of tapered wedged prisms stacked in alternating orientations. The expression "tapered wedged" is being used here to indicate that each prism is shaped like a wedge when viewed from one side, and is an isosceles triangle when viewed from above. The tip of the isosceles triangle corresponds with the thick end of the wedge. An input face 46 of the beam separating element 40 is planar, with an output face made up of the tapered wedged prisms serving as refractive optical elements. A side view of a single wedged prism 45a is schematically depicted in FIG. 5B. Part of the incident laser beam 24 is incident upon a planar input face 46 of the wedged prism 45a with a normal angle of incidence. An angled output face 47a of the wedged prism 45 forms a sub-beam 24a which propagates at an angle relative to the optical axis OA. A side view of another, second wedged prism 45b of the beam separating element 40 is depicted in FIG. 5C. The angled output face 47b of this wedged prism 45b slopes in an opposite direction to the angled output face 47a of the wedged prism 45a depicted in FIG. 5B. As a result, a sub-beam 24b is formed which propagates in an opposite direction to the sub-beam 24a formed by the first wedged prism. Referring again to FIG. 4, the first part 42 of the beam separating element 40 is formed from tapered wedged prisms 45a as depicted in FIG. 5B, and the second part 43 is formed from tapered wedged prisms 45b as depicted in FIG. 5C.

In the simplified embodiment of FIGS. 4 and 5, as noted above, the incident laser beam 24 is separated into only two sub-beams 24a,b. Each of these two sub-beams 24a,b may be separated into two further sub-beams using a second beam separating element (not depicted) which corresponds with the first beam separating element 40 but which has been rotated about the optical axis OA by 90 degrees. This will separate the incident laser beam 24 into four sub-beams 24a-d with relative intensities which depend upon the position of the incident laser beam 24.

The above embodiment of the invention illustrates the principle of operation of the invention, and may be formed using tapered wedged prisms. However, in practice it may be difficult to position tapered wedged prisms with the arrangement depicted in FIG. 5A. Other embodiments, as discussed below, may be easier to implement and less expensive.

A beam separating element 50 according to an alternative embodiment of the invention is depicted in FIGS. 6 and 7. This embodiment may be referred to as a refractive optical element (ROE). The beam separating element 50 of FIGS. 6 and 7 provides the same functionality as the beam separating element 40 of FIGS. 4 and 5 together with a second beam separating element which has been rotated through 90 degrees about the optical axis (as described above). In the embodiment of FIGS. 6 and 7 the refractive optical element 50 may be considered to be an array of cells. A given cell includes a first area which forms a first sub-beam directed towards a first sensor, a second area which forms a second sub-beam directed towards a second sensor, a third area which forms a third sub-beam directed towards a third sensor and a fourth area which forms a fourth sub-beam directed towards a fourth sensor. The relative sizes of the first to fourth areas within the cell determines the relative intensities of radiation images of the sub-beams.

Figure 6A:
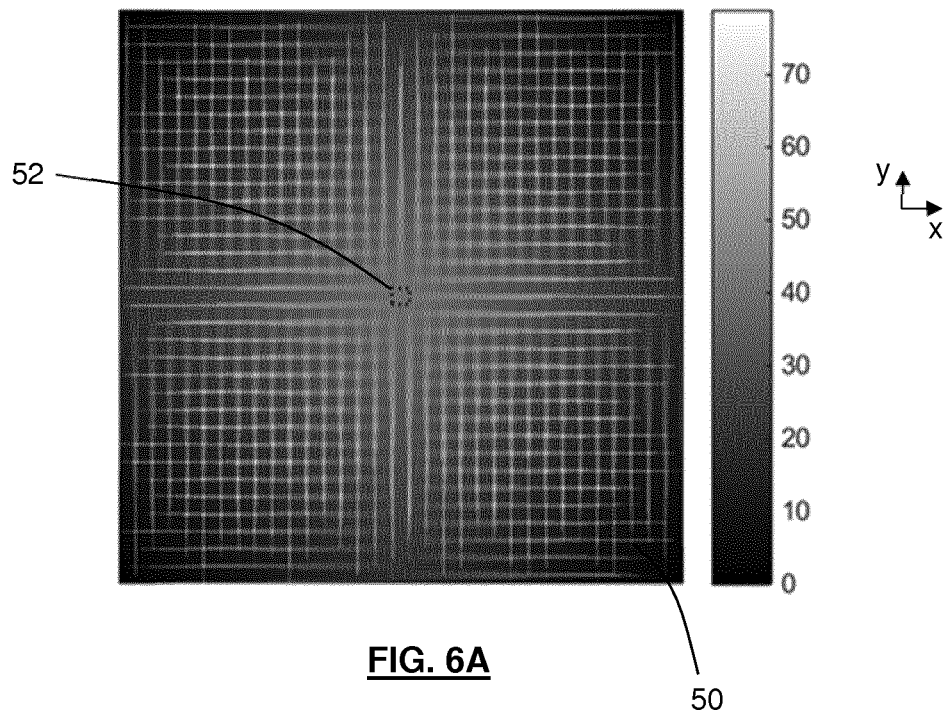
FIGS. 6A-6B depict an alternative beam separating element which may form part of a laser beam monitoring system according to an embodiment of the invention.
Figure 6B:
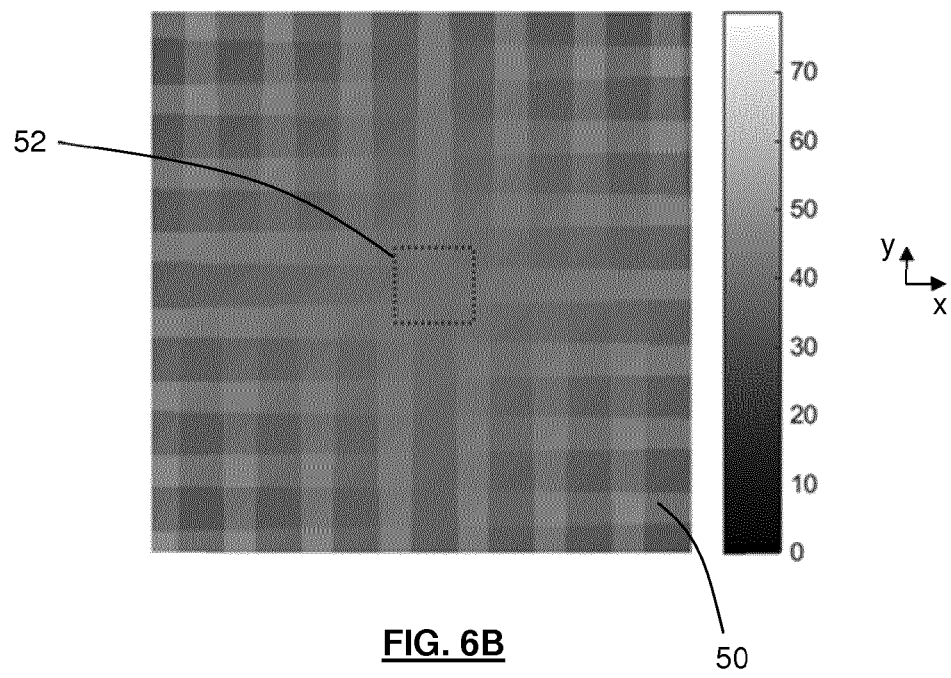

FIG. 6A depicts the refractive optical element 50 according to an embodiment, and FIG. 6B depicts a central part of the embodiment in more detail. The shading indicates the thickness of the refractive optical 50 element in microns. The wavelength of the incident laser beam may be around 10 microns. A single cell 52 of the refractive optical element is identified by the rectangle indicated with a dotted line. This cell is depicted in an enlarged view in FIG. 7A. FIG. 7B is a graph indicating the optical path difference experienced by the incident laser beam as a function of cross-sectional position on the single cell 52. The vertical axis of the graph indicates the local thickness of the cell in microns and the horizontal axis indicates spatial position on the cell in mm.

The cell 52 may be considered to have a central part 53, four corner parts 54a-d, a first pair of side parts 55a,b and a second pair of side parts 56a,b. Because the cell 52 is the central cell of the refractive optical element 50, each part or set of parts has the same area. Thus, the central part 53 has the same area as the four corner parts 54a-d combined, and as the first pair of side parts 55a,b combined and as the second pair of side parts 56a,b combined. Each different part or different set of similar parts forms a radiation sub-beam which is directed towards a different sensor 34a-d (see FIG. 2B).

Considering first the central part 53, this part has an output face which is sloped in the x=y direction and thus has an optical path difference which increases as x and y increase. With reference to FIGS. 7 and 2B in combination, the sloped output face of the central part 53 directs a radiation sub-beam 24d towards the upper right hand sensor 34d.

Considering the four corner parts 54a-d, the optical path differences provided by two of these corner parts 54b,d are indicated on the x=y line of the graph of FIG. 7B. The slope of the output faces of the corner parts 54b,d is opposite to the slope of the central part (the optical path difference decreases as x and y increase). With reference to FIG. 7 and FIG. 2B in combination, the two sloped corner parts 54b,d direct a radiation sub-beam 24b towards the bottom left hand sensor 34b. The other two corner parts 54a,c also have same sloped output faces and so also direct a radiation sub-beam towards the bottom left hand sensor 34b.

The first pair of side parts 55a,b have output faces which are sloped in the x=−y direction. This slope is partially seen in the y=0 line of FIG. 7B. With reference to FIG. 7 and FIG. 2B in combination, the first pair of side parts 55a,b direct a radiation sub-beam 24c towards the bottom right hand sensor 34c.

The second pair of side parts 56a,b have output faces which are sloped in the x=−y direction but with the slope having an opposite sign from the first pair of side parts 55a,b. This slope is partially seen in the x=0 line of FIG. 7B. With reference to FIG. 7 and FIG. 2B in combination, the second pair of side parts 56a,b direct a radiation sub-beam 24a towards the top left hand sensor 34a.

The relative areas of the parts or sets of parts of each cell 52 changes as function of cell position on the refractive optical element 50. As noted above, in the central cell 52 depicted in FIG. 7A the central part has the same area as each of the sets of parts. However, in a cell which is located towards top right hand corner of the refractive optical element 50, the central part 53 is bigger than each of the other sets of parts 54a-d, 55a,b, 56a,b. Consequently, if part of the incident radiation beam 24 is incident upon that cell, the resulting sub-beam which is directed towards the top right hand sensor 34d will have a higher intensity than the resulting sub-beams directed towards the other sensors 34a-c. Similarly, in a cell which is located towards bottom left hand corner of the refractive optical element 50, the corner parts 54a-d have a combined area which is bigger than the central part 53 and each of the side parts 55a,b, 56a,b. Consequently, if part of the incident radiation beam 24 is incident upon that cell, the resulting sub-beam which is directed towards the bottom left hand sensor 34b will have a higher intensity than the resulting sub-beams directed towards the other sensors 34a,c,d.

The area of a part or set of parts of a cell may vary as a function of spatial position with respect to a central cell 52 of the refractive optical element 50. In an embodiment, when travelling along a diagonal (x=y or x=−y) the area of one part or set of parts may increase or decrease at the expense of all of the others. For example, the central part 53 becomes bigger whilst the other sets of parts all become smaller. When travelling along x=0 or y=0 a combination of parts become bigger at the expense of another combination of parts. For example, when moving along the y=0 direction the central part 53 and the first pair of side parts 55a,b become bigger whilst the corner parts 54a-d and the second pair of side parts 56a,b become smaller. The changes of area may be linear as a function of position on the refractive optical element, or may be nonlinear.

The above is merely an example. In general, cells of the refractive optical element 50 may be provided with different parts or sets of parts which have areas that depend upon the spatial positions of the cells on the refractive optical element. The parts may direct radiation sub-beams towards sensors provided in any suitable arrangement.

The cumulative effect of such an arrangement is that the weighting of different parts or sets of parts 53, 54a-d, 55a,b 56a,b varies across the refractive optical element 50. For example, the weighting of central parts 53 that direct the radiation sub-beam 24d towards the top right sensor 34d varies as function of spatial position on the refractive optical element 50.

In an embodiment, the different parts or sets of parts 53, 54a-d, 55a,b 56a,b may each be weighted towards a different zone of the refractive optical element. The different zones may each comprise one quarter of the refractive optical element 50. The central parts 53 may be weighted towards a zone which is the upper right hand quarter of the refractive optical element 50. The corner parts 54a-d may be weighted towards a zone which is the bottom left hand quarter of the refractive optical element 50. The first pair of side parts 55a,b may be weighted towards a zone which is the bottom right hand quarter of the refractive optical element. The second pair of side parts 56a,b may be weighted towards a zone which is the top left hand quarter of the refractive optical element Other weightings towards other zones may be used.

Figure 8A:
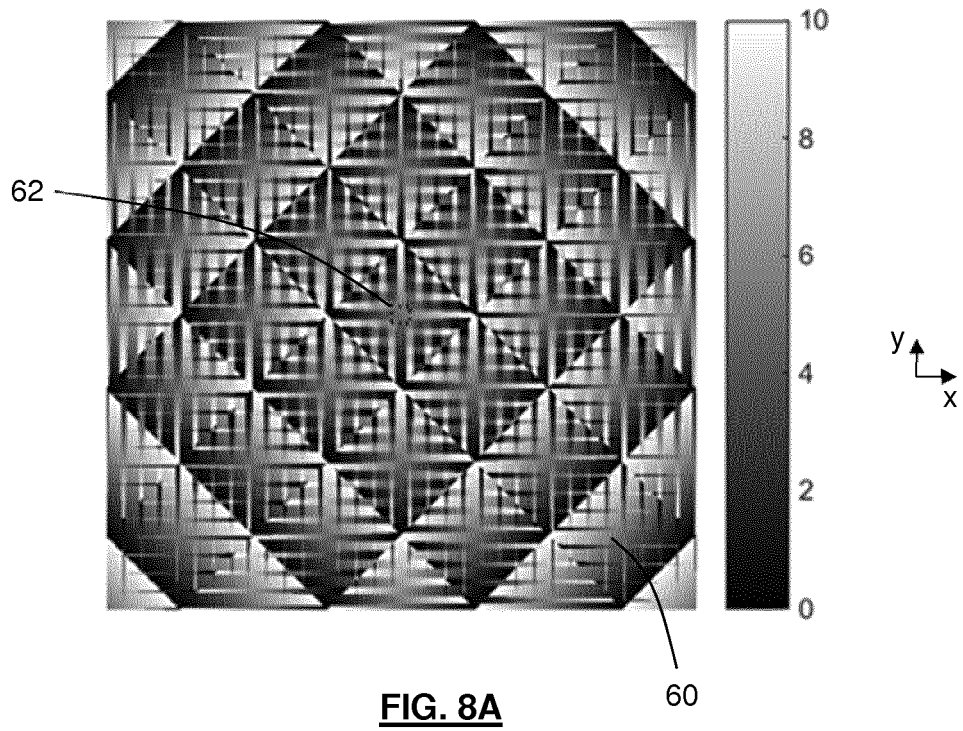
FIGS. 8A-8B depict a further alternative beam separating element which may form part of a laser beam monitoring system according to an embodiment of the invention.
Figure 8B:
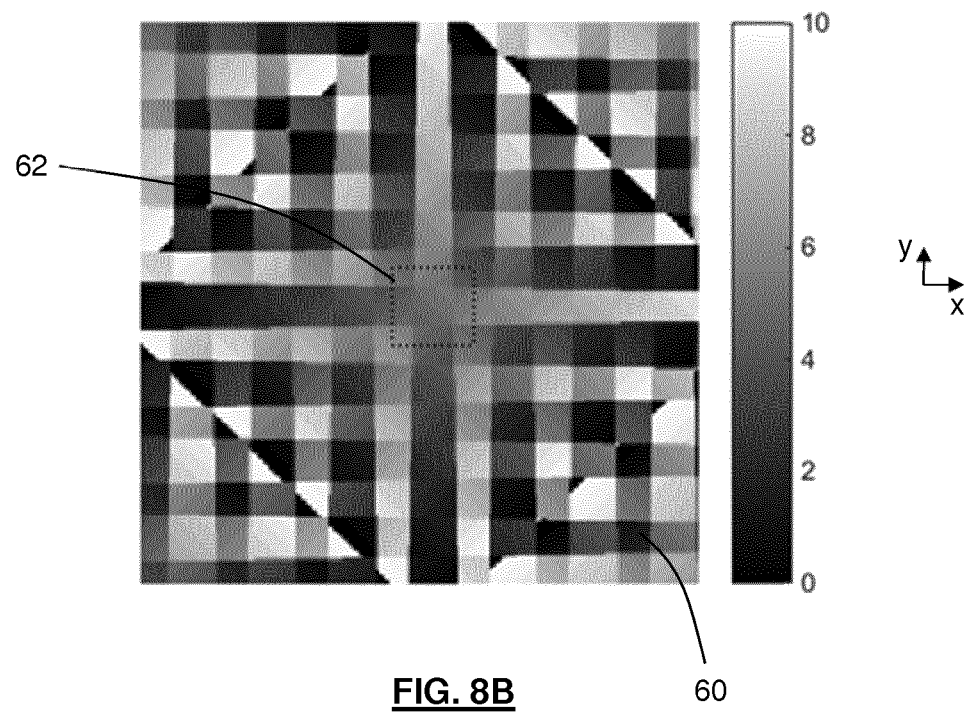

FIG. 8A depicts a diffractive optical element 60 according to an embodiment, and FIG. 8B depicts a central part of the embodiment in more detail. The shading indicates the thickness of the diffractive optical element 60. A single central cell 62 of the diffractive optical element is identified by a dotted line. This cell is depicted in an enlarged view in FIG. 9A. FIG. 9B is a graph indicating the optical path difference experienced by the incident laser beam as a function of cross-sectional position on the single cell 62. The vertical axis of the graph indicates the thickness of the cell in microns and the horizontal axis indicates spatial position on the cell in mm.

The diffractive optical element 60 corresponds with the refractive optical element, except that instead of having an output face formed from slopes it has a stepped output face. In this embodiment the depth of the steps corresponds to around one third of a micron. The wavelength of the incident radiation beam is 10 microns in this embodiment. The depth of the steps is such that constructive interference of radiation exiting the diffractive optical element in particular directions occurs. In other words, diffraction occurs. The diffraction provides radiation sub-beams having a form corresponds with that depicted further above in FIG. 2.

Figure 7A:
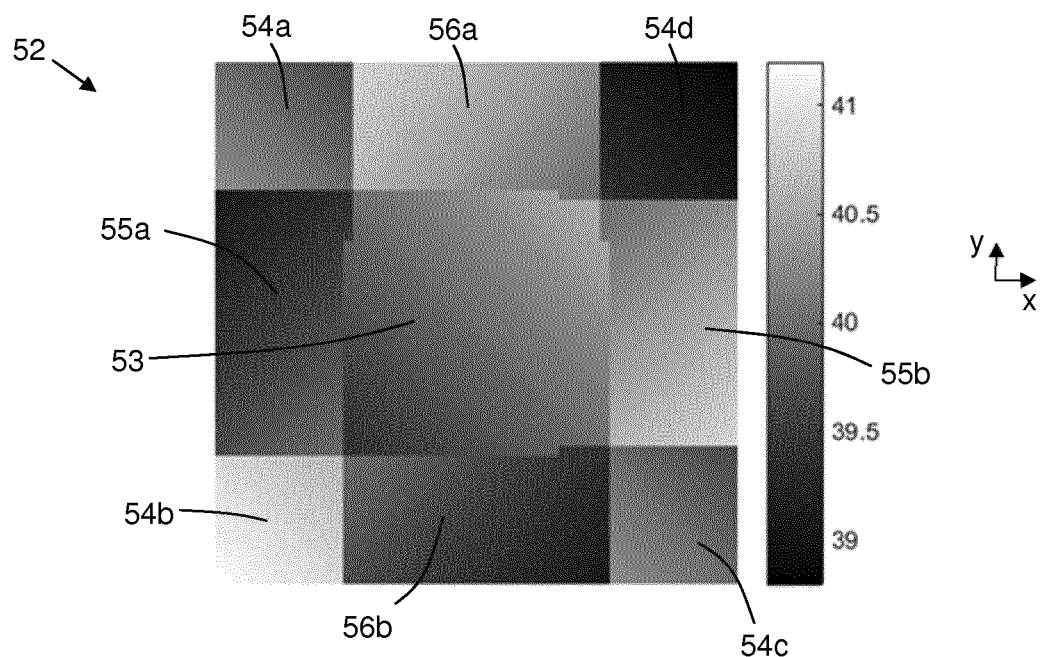
FIGS. 7A-7B depict a single cell of the beam separating element of FIG. 6, and a graph showing an optical path difference provided by that cell as a function of cross-section position on the cell.
Figure 7B:
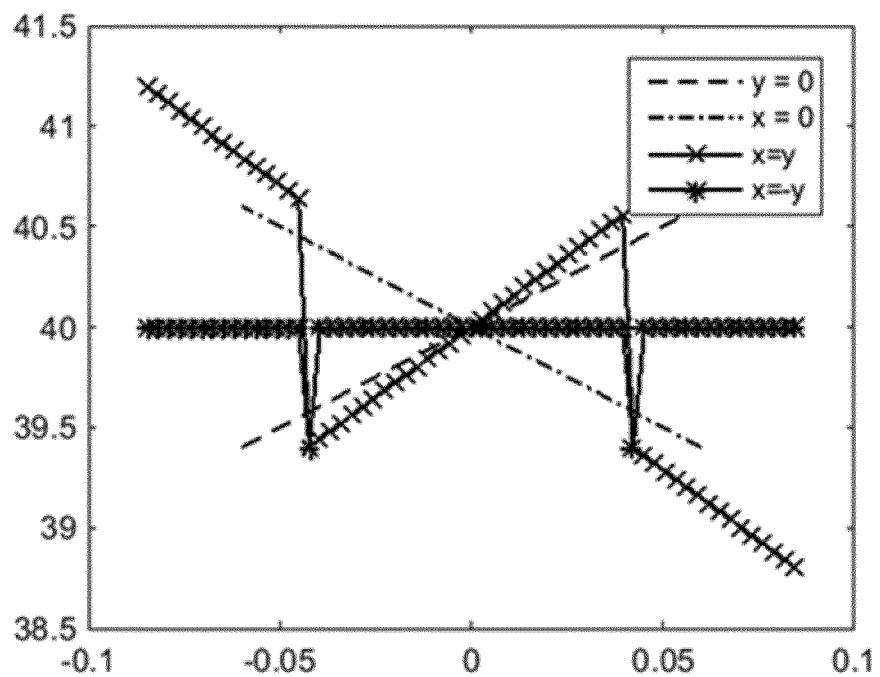
Figure 9A:
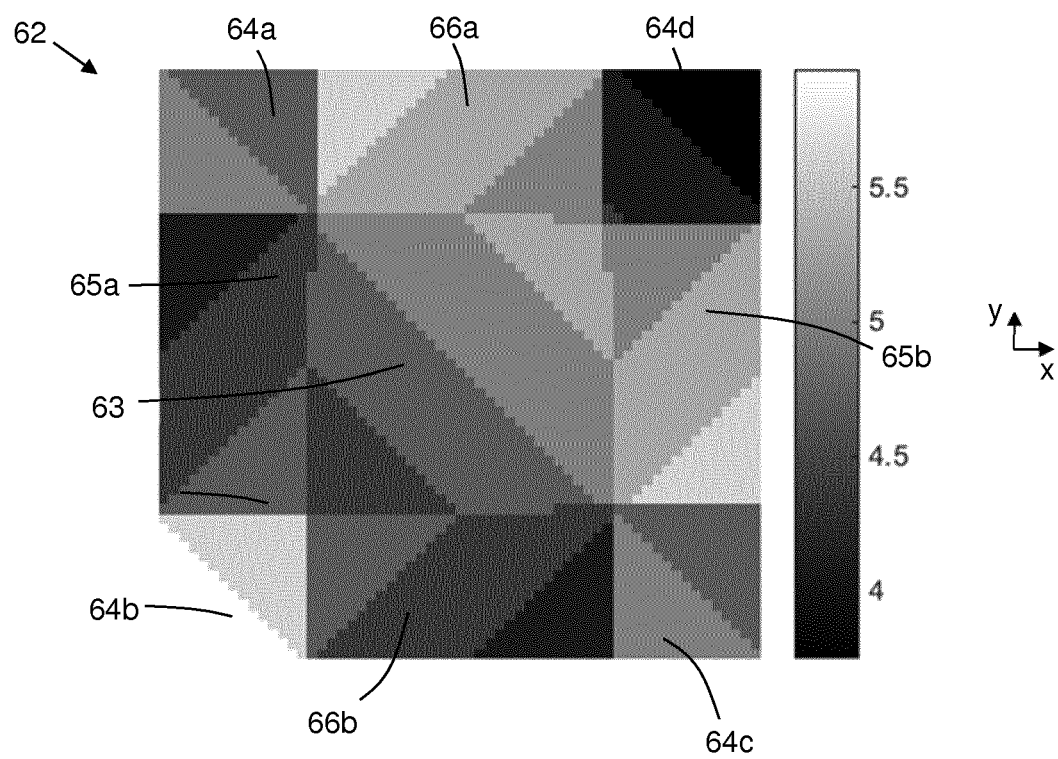
FIGS. 9A-9B depict a single cell of the beam separating element of FIG. 8, and a graph showing an optical path difference provided by that cell as a function of cross-section position on the cell.
Figure 9B:
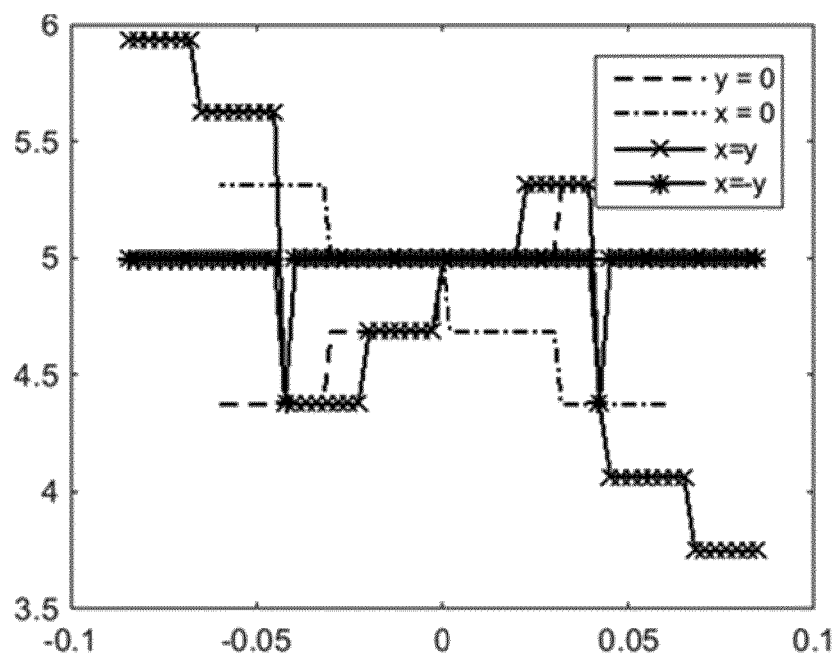

In common with the cell depicted in FIG. 7A, the cell 62 of FIG. 9A may be considered to have a central part 63, four corner parts 64a-d, a first pair of side parts 55a,b and a second pair of side parts 66a,b. Because the cell 62 is the central cell of the refractive optical element 60, each part or set of parts has the same area. Thus, the central part 63 has the same area as the four corner parts 64a-d, the first pair of side parts 65a,b and the second pair of side parts 66a,b. Each part or set of parts forms a radiation sub-beam which is directed towards a different sensor 34a-d (see FIG. 2B).

Considering first the central part 63, this part has an output face which is stepped in the x=y direction and thus has an optical path difference which increases as x and y increase. With reference to FIGS. 9 and 2B in combination, the sloped output face of the central part 63 directs a radiation sub-beam 24d towards the upper right hand sensor 34d.

Considering the four corner parts 64a-d, the optical path differences provided by two of these corner parts 64b,d are indicated on the x=y line of the graph of FIG. 9B. The steps of the output faces of the corner parts 54*b,d* are opposite to the steps of the central part (the optical path difference decreases as x and y increase). With reference to FIG. 9 and FIG. 2B in combination, the two sloped corner parts 64*b,d* direct a radiation sub-beam 24*b* towards the bottom left hand sensor 34*b*. The other two corner parts 64*a,c* also have same stepped output faces and so also direct a radiation sub-beam towards the bottom left hand sensor 34*b*.

The first pair of side parts 65*a,b* have output faces which are stepped in the x=−y direction. These steps are seen in the y=0 line of FIG. 9B. With reference to FIG. 9 and FIG. 2B in combination, the first pair of side parts 65*a,b* direct a radiation sub-beam 24*c* towards the bottom right hand sensor 34*c*.

The second pair of side parts 66*a,b* have output faces which are stepped in the x=−y direction but with the steps having an opposite sign from the first pair of side parts 65*a,b*. This slope is seen in the x=0 line of FIG. 9B. With reference to FIG. 9 and FIG. 2B in combination, the second pair of side parts 66*a,b* direct a radiation sub-beam 24*a* towards the top left hand sensor 34*a*.

The area of a part or set of parts of a cell may vary as a function of spatial position with respect to a central cell 62 of the diffractive optical element 60. This variation may for example be as described above in connection with the refractive optical element 50.

The above is merely an example. In general, cells of the diffractive optical element may be provided with different parts or sets of parts which have areas that depend upon the spatial positions of the cells on the diffractive optical element. The parts may direct radiation sub-beams towards sensors provided in any suitable arrangement.

The cumulative effect of such an arrangement is that the weighting of different parts or sets of parts 63, 64*a-d*, 65*a,b* 66*a,b* varies across the diffractive optical element 60. For example, the weighting of central parts 63 that direct the radiation sub-beam 24*d* towards the top right sensor 34*d* varies as function of spatial position on the refractive optical element 60.

In an embodiment, the different parts or sets of parts 63, 64*a-d*, 65*a,b* 66*a,b* may each be weighted towards a different zone of the refractive optical element. The different zones may each comprise one quarter of the refractive optical element 60. The central parts 63 may be weighted towards a zone which is the upper right hand quarter of the refractive optical element 60. The corner parts 64*a-d* may be weighted towards a zone which is the bottom left hand quarter of the refractive optical element 60. The first pair of side parts 65*a,b* may be weighted towards a zone which is the bottom right hand quarter of the refractive optical element. The second pair of side parts 56*a,b* may be weighted towards a zone which is the top left hand quarter of the refractive optical element Other weightings towards other zones may be used.

The diffractive optical element 60 may be easier and cheaper to produce than the refractive optical element 50. This is because a stepped surface may be easier to form than a sloped surface. In general, a beam separating element which is a diffractive optical element may be easier to produce than a beam separating element which is a refractive optical element.

The size of the cells of the beam separating element 50, 60 may be selected with reference to the size of the incident laser beam 24 such that several cells (e.g. at least 5 cells) will be located within the full width half maximum of the incident laser beam during use. This avoids significant ripple of the output from the detectors 34*a-d* when the incident laser beam 24 moves across the beam separating element 50, 60. In one example, the incident laser beam 24 may have a full width half maximum of around 5 mm. In such an example the cells may for example have a pitch of 1 mm or less. In general the cells may have a pitch of 1 mm or less. The cells may for example have a pitch of around 100 microns. The minimum pitch of the cells may be limited by the process which is used to make the beam separating element 50, 60. In general, the pitch of the cells may depend upon the spatial resolution with which it is desired to determine the position of the incident laser beam 24.

The beam separating element 30, 40, 50, 60 may be sufficiently large to ensure that the laser beam is always incident upon the beam separating element 50, 60. The beam separating element 30, 40, 50, 60 may for example measure at least 1 cm across. The beam separating element 30, 40, 50, 60 may for example measure up to 5 cm across, and may for example measure up to 10 cm across. The beam separating element 30, 40, 50, 60 may for example measure around 25 mm across. The number of cells in the beam separating element may be determined from a combination of the desired spatial resolution and the size of the beam separating element.

An advantage of the invention is that it allows the position of the incident laser beam 24 to be monitored in a straightforward manner which does not suffer from error if the spatial intensity distribution in a cross-section of the laser beam changes. For example, a change may occur of the cross-sectional spatial position of the highest intensity area of the laser beam (e.g. a change from a Gaussian profile to some other profile). When such a change occurs this in turn will be seen in the signals output from the detectors 34*a-d*. In other words, signals output from the detectors 34*a-d* indicate a 'center of gravity' of the incident laser beam 24. The output signals therefore allow the center of gravity of the laser beam 2 of the radiation source S0 to be directed towards the plasma formation region 4. The 'center of gravity' of the laser beam 2 may be the center of the laser beam (determined as a function of laser beam intensity).

Other embodiments of the invention may be used to monitor properties of the laser beam other than its spatial position. For example, a radial beam size of the laser beam may be determined using a beam separating element which has radially arranged cells. Such an arrangement may for example use two sensors and cells which form weighted sub-beams depending upon the radial position of those cells on the beam separating element. A cell at the center of the beam separating element may direct a sub-beam with substantially all of the incident laser radiation towards a first detector. Moving radially outwards, cells may direct less and less of the incident laser towards the first sensor and direct more and more of the incident laser beam towards a second sensor. In such an embodiment the relative intensities of sub-beams incident at the first and second detectors are determined by the radial size of the incident laser beam. Embodiments of the invention such as those described further above may be used to correct for the effect of spatial movement of the incident laser beam away from the center of the beam separating element if desired. In other words, two different embodiments of the invention may be used to monitor the same laser beam. One embodiment may measure the spatial position of the laser beam, and one may measure the radial size.

Although the laser beam monitoring system described above forms part of a radiation source for a lithographic apparatus, the laser beam monitoring system has other applications. In general, a laser beam monitoring system according to an embodiment of the invention may be used in any application in which it is desired to monitor a property of a laser beam.

The laser beam monitoring system may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

The laser beam monitoring system may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A laser beam monitoring system configured to monitor an attribute of an incident laser beam, the laser beam monitoring system comprising:
a beam separating element; and
a plurality of sensors,
wherein the beam separating element is configured to form a plurality of sub-beams from the incident laser beam, a first sub-beam being directed towards a first sensor of the plurality of sensors and a second sub-beam being directed towards a second sensor of the plurality of sensors,
wherein relative intensities of the first and second sub-beams are determined by a spatial position at which the incident laser beam is incident upon the beam separating element.

2. The laser beam monitoring system of claim 1, wherein: the beam separating element comprises intermixed first and second parts that are configured to form first and second sub-beams.

3. The laser beam monitoring system of claim 2, wherein: the first parts occupy a greater proportion of a first area of the beam separating element than the second parts; and the second parts occupy a greater proportion of the second area of the beam separating element than the first parts.

4. The laser beam monitoring system of claim 3, wherein: the beam separating element further includes third and fourth parts, the third and fourth parts being configured to also form a third sub-beam directed towards a third sensor of the plurality of sensors and a fourth sub-beam directed towards a fourth sensor of the plurality of sensors; and
relative intensities of the first, second, third and fourth sub-beams are determined by the spatial position at which the incident laser beam is incident upon the beam separating element.

5. The laser beam monitoring system of claim 4, wherein the first parts of the beam separating element which forms the first sub-beam, the second parts of the beam separating element which forms the second sub-beam, the third parts of the beam separating element which forms the third sub-beam, and the fourth parts of the beam separating element which forms the fourth sub-beam are intermixed with each other.

6. The laser beam monitoring system of claim 5, wherein the first parts occupy a greater proportion of a first area of the beam separating element than any of the second, third or fourth parts.

7. The laser beam monitoring system of claim 2, wherein the different parts are provided with weighted spatial distributions across the beam separating element.

8. The laser beam monitoring system of claim 7, wherein the spatial distribution of the first part is weighted towards a first zone of the beam separating element, such that when the incident laser beam is incident upon the first zone the incident laser beam predominantly forms the first sub-beam.

9. The laser beam monitoring system of claim 8, wherein the first and second zones each comprise one quarter of the beam separating element.

10. The laser beam monitoring system of claim 7, wherein the spatial distribution of the second part is weighted towards a second zone of the beam separating element, such that when the incident laser beam is incident upon the second zone the incident laser beam predominantly forms the second sub-beam.

11. The laser beam monitoring system of claim 7, wherein the beam separating element comprises cells formed from the different parts.

12. The laser beam monitoring system of claim 11, wherein the areas of different parts that form the cells vary as a function of spatial cell position across the beam separating element.

13. The laser beam monitoring system of claim 1, wherein the beam separating element is a refractive optical element.

14. The laser beam monitoring system of claim 1, wherein the beam separating element is a diffractive optical element.

15. The laser beam monitoring system of claim 1, further comprising focusing optics that are provided between the beam separating element and the sensors.

16. The laser beam monitoring system of claim 1, wherein the beam separating element is transmissive.

17. A beam separating element configured for use in the laser beam monitoring system of claim 1.

18. A radiation source comprising:
   a laser system;
   a laser beam monitoring system configured to monitor an attribute of an incident laser beam;
   the laser beam monitoring system comprising:
      a beam separating element; and
      a plurality of sensors,
         wherein the beam separating element is configured to form a plurality of sub-beams from the incident laser beam, a first sub-beam being directed towards a first sensor of the plurality of sensors and a second sub-beam being directed towards a second sensor of the plurality of sensors,
         wherein relative intensities of the first and second sub-beams are determined by a spatial position at which the incident laser beam is incident upon the beam separating element;
   a fuel emitter; and
   a radiation collector.

19. The radiation source of claim 18, further comprising a controller arranged to adjust the laser beam using outputs received from the plurality of sensors.

20. The radiation source of claim 18, wherein the radiation source further comprises a second laser beam monitoring system configured to monitor an attribute of the laser beam after reflection from a fuel target.

21. A lithographic system comprising:
   a lithographic apparatus arranged to project a pattern from a patterning device onto a substrate;
   and
   the radiation source of claim 18.

22. A method of monitoring a laser beam, the method comprising:
   directing an incident laser beam onto a beam separating element;
   forming a plurality of sub-beams from the incident laser beam;
   detecting a first sub-beam using a first sensor of a plurality of sensors; and
   detecting a second sub-beam using a second sensor of the plurality of sensors,
   wherein relative intensities of the first and second sub-beams are determined by a spatial position at which the incident laser beam is incident upon the beam separating element.

* * * * *